United States Patent
Sur et al.

[11] Patent Number: 5,811,346
[45] Date of Patent: Sep. 22, 1998

[54] SILICON CORNER ROUNDING IN SHALLOW TRENCH ISOLATION PROCESS

[75] Inventors: Harlan Sur, San Leandro; Olivier Laparra, San Jose; Dipankar Pramanik, Saratoga, all of Calif.

[73] Assignee: VLSI Technology, Inc., San Jose, Calif.

[21] Appl. No.: 837,161

[22] Filed: Apr. 14, 1997

[51] Int. Cl.$^6$ .................................................. H07L 21/76
[52] U.S. Cl. ..................... 438/424; 438/425; 438/426; 438/437; 148/DIG. 50
[58] Field of Search .................................. 438/424, 425, 438/426, 427, 435, 437; 148/DIG. 50

[56] References Cited

U.S. PATENT DOCUMENTS

| | | | |
|---|---|---|---|
| 4,916,086 | 4/1990 | Takahashi et al. | 438/435 |
| 5,130,268 | 7/1992 | Liou et al. | 438/425 |
| 5,674,775 | 10/1997 | Ho et al. | 148/DIG. 50 |
| 5,719,085 | 2/1998 | Moon et al. | 438/435 |

*Primary Examiner*—Trung Dang
*Attorney, Agent, or Firm*—Wagner, Murabito & Hao

[57] ABSTRACT

A semiconductor device isolating structure and method for forming such a structure. In one embodiment, an opening is formed through a mask layer overlying a semiconductor substrate. A trench of a desired depth is then etched into the semiconductor substrate at the area of the semiconductor substrate underlying the opening in the mask layer. The trench is then filled with a dielectric material. After an oxide planarizing process, the present invention exposes the dielectric-filled trench to an oxidizing environment. By filling the trench with dielectric material prior to the oxidization step, the present invention selectively oxidizes the semiconductor substrate at corners formed by the intersection of the sidewalls of the trench and the top surface of the semiconductor substrate. In so doing, the present invention forms smoothly rounded semiconductor substrate corners under the mask layer. Thus, the present invention eliminates the sharp upper corners associated with prior art shallow trench isolation methods.

18 Claims, 7 Drawing Sheets

SILICON CORNER ROUNDING IN SHALLOW TRENCH ISOLATION PROCESS

TECHNICAL FIELD

The present claimed invention relates to the field of semiconductor devices. More specifically, the present claimed invention relates to semiconductor device isolating structures.

BACKGROUND ART

As process technology has been evolving to submicron geometries, Shallow trench isolation (STI) has been gradually replacing conventional semiconductor device isolating methods such as, for example, local oxidation of silicon (LOCOS). STI provides several major advantages over LOCOS methods. For example, STI methods allow for higher device density by decreasing the required width of the semiconductor device isolating structure. As yet another benefit, STI enhances surface planarity which, in turn, considerably improves critical dimension control during lithography steps.

Referring now to Prior Art FIGS. 1A–1D, side-sectional views illustrating steps used in a prior art STI process are shown. As shown in Prior Art FIG. 1A, a substrate 100 has an oxide 102 and nitride 104 stack formed thereon. The oxide 102 and nitride 104 stack are used as to mask underlying semiconductor substrate 100 during subsequent STI process steps.

As shown in Prior Art FIG. 1B, using conventional masking and photolithography steps, a typical STI process forms an opening 106 extending through the oxide 102 and nitride 104 stack. Opening 106 extends to the top surface of semiconductor substrate 100.

Referring next to FIG. 1C, in a conventional STI process, a plasma etch or other type of dry etch is then used to etch an opening or "trench" into semiconductor substrate 100. A cross-sectional view of a trench 108 is shown in Prior Art FIG. 1C.

Referring still to Prior Art FIG. 1C, conventionally fabricated trench 108 contains yet another substantial disadvantage. Namely, the interface of vertically oriented sidewalls 110a and 110b and the top surface of semiconductor substrate 100 produces sharp corners 114 and 116. As a result, stress in the contact between subsequently deposited dielectric material and semiconductor substrate 100 is generated at sharp corners 114 and 116. In addition, the electric field at sharp corners 114 and 116 contributes to parasitic subthreshold leakage and degrades gate oxide integrity.

Referring next to Prior Art FIG. 1D, dielectric material 118 is shown deposited into trench 108. (Prior Art FIG. 1D shows only a portion of dielectric material 118 near sharp corner 114 for purposes of clarity. It will be understood that condition described below also occurs in dielectric material 118 near corner 116.) The stresses induced by sharp corner 114 accelerate the etch rate of dielectric material 118 near sharp corner 114 during subsequent etch steps As a result, a depression 120 is formed in dielectric material 118 near sharp corner 114. The deleterious creation of depression 120 is referred to as "trenching wrap-around". During subsequent process steps, a gate oxide layer 122, for example, is formed as shown in Prior Art FIG. 1D. However, the above-described trenching wrap-around condition causes gate oxide layer 122 to be thinner near sharp corner 114. The reduction in the thickness of gate oxide layer 122 results in poor gate oxide integrity.

Attempts have been made to prevent the formation of sharp corners during the STI process. Such prior art attempts usually involve changes in the etch chemistries used during the STI process. Unfortunately, changing of the etch chemistries alters various other isolating device parameters, and dramatically complicates the STI process.

In other approaches to prevent the formation of sharp corners, numerous additional process steps are added to the conventional STI process. These approaches typically attempt to build stress relieving features at or near the sharp corners by rounding them. However, such approaches significantly complicate the STI process resulting in increased cost, decreased throughput, and reduced yield.

Thus, a need exists for semiconductor device isolating structure which does not have sharp stress-generating corners. A need also exists for a method to form a semiconductor device isolating structure wherein the method does not require altering of conventional STI etching chemistries. Yet another need exists for a method to form a semiconductor device isolating structure wherein the method does not significantly complicate the STI process.

DISCLOSURE OF THE INVENTION

The present invention provides a semiconductor device isolating structure which does not have sharp stress-generating corners. The present invention also provides a method to form a semiconductor device isolating structure wherein the method does not require altering of conventional STI etching chemistries. The present invention further provides a method to form a semiconductor device isolating structure wherein the method does not significantly complicate the STI process.

Specifically, in one embodiment, an opening is formed through a mask layer overlying a semiconductor substrate. A trench of a desired depth is then etched into the semiconductor substrate at the area of the semiconductor substrate underlying the opening in the mask layer. The trench is then filled with a dielectric material. After an oxide planarizing process, the present invention exposes the dielectric-filled trench to an oxidizing environment. By filling the trench with dielectric material prior to the oxidization step, the present invention selectively oxidizes the semiconductor substrate at top corners formed by the intersection of the sidewalls of the trench and the top surface of the semiconductor substrate. In so doing, the present invention forms smoothly rounded semiconductor substrate corners under the mask layer. Thus, the present invention eliminates the sharp upper corners associated with prior art shallow trench isolation methods.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

Prior Art

Prior Art

Prior Art

Prior Art

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1A:
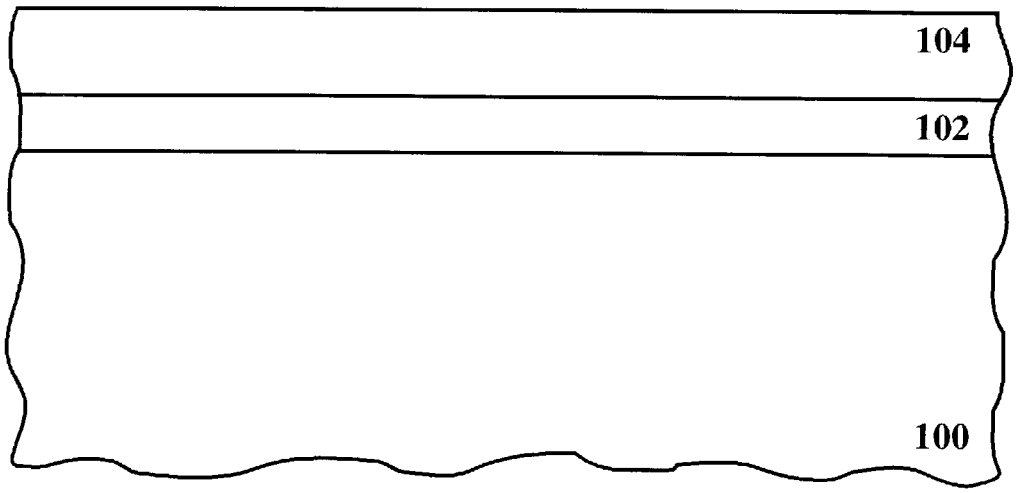
FIG. 1A is a cross-sectional view illustrating steps associated with a prior art STI process.
Figure 1B:
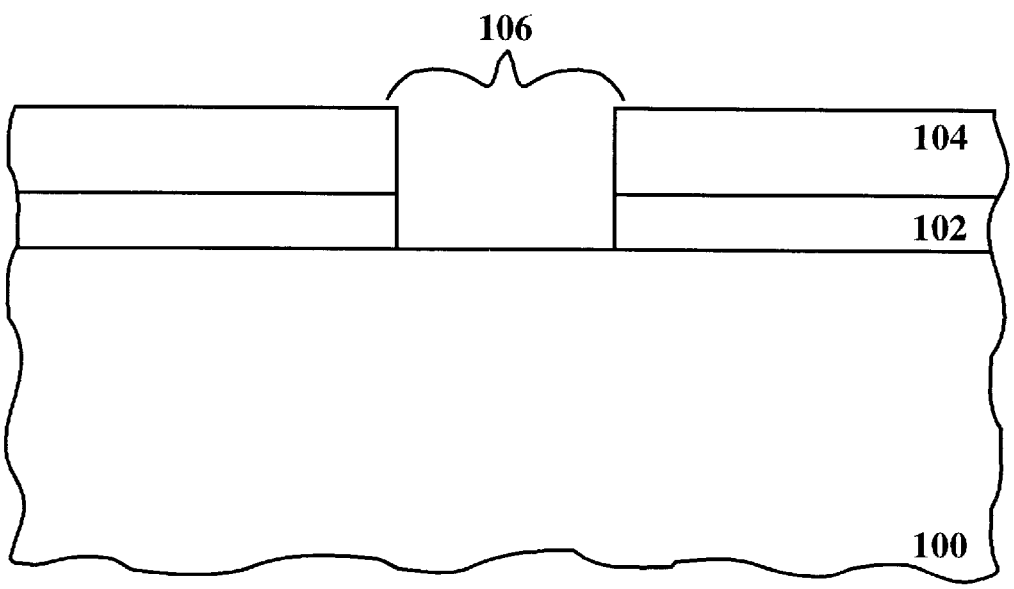
FIG. 1B is a cross-sectional view illustrating steps associated with a prior art STI process.
Figure 1C:
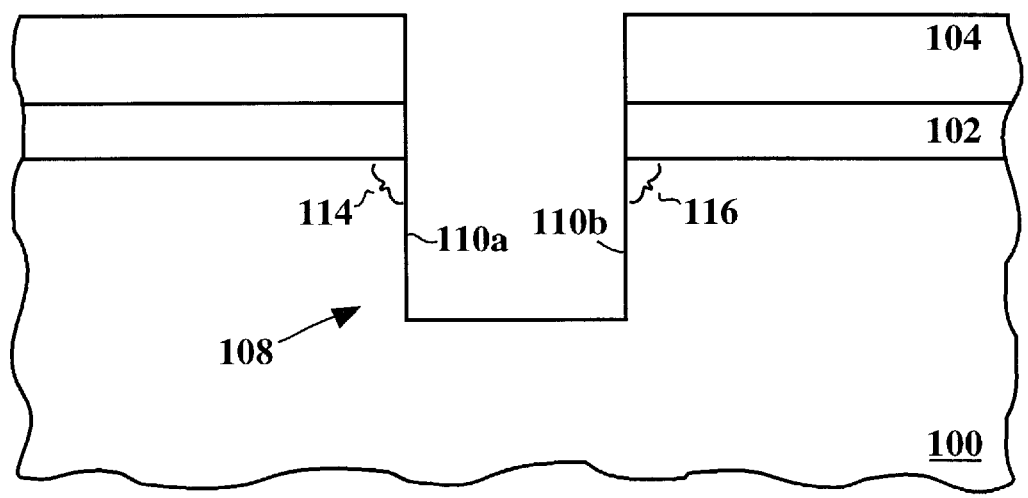
FIG. 1C is a cross-sectional view illustrating steps associated with a prior art STI process.
Figure 1D:
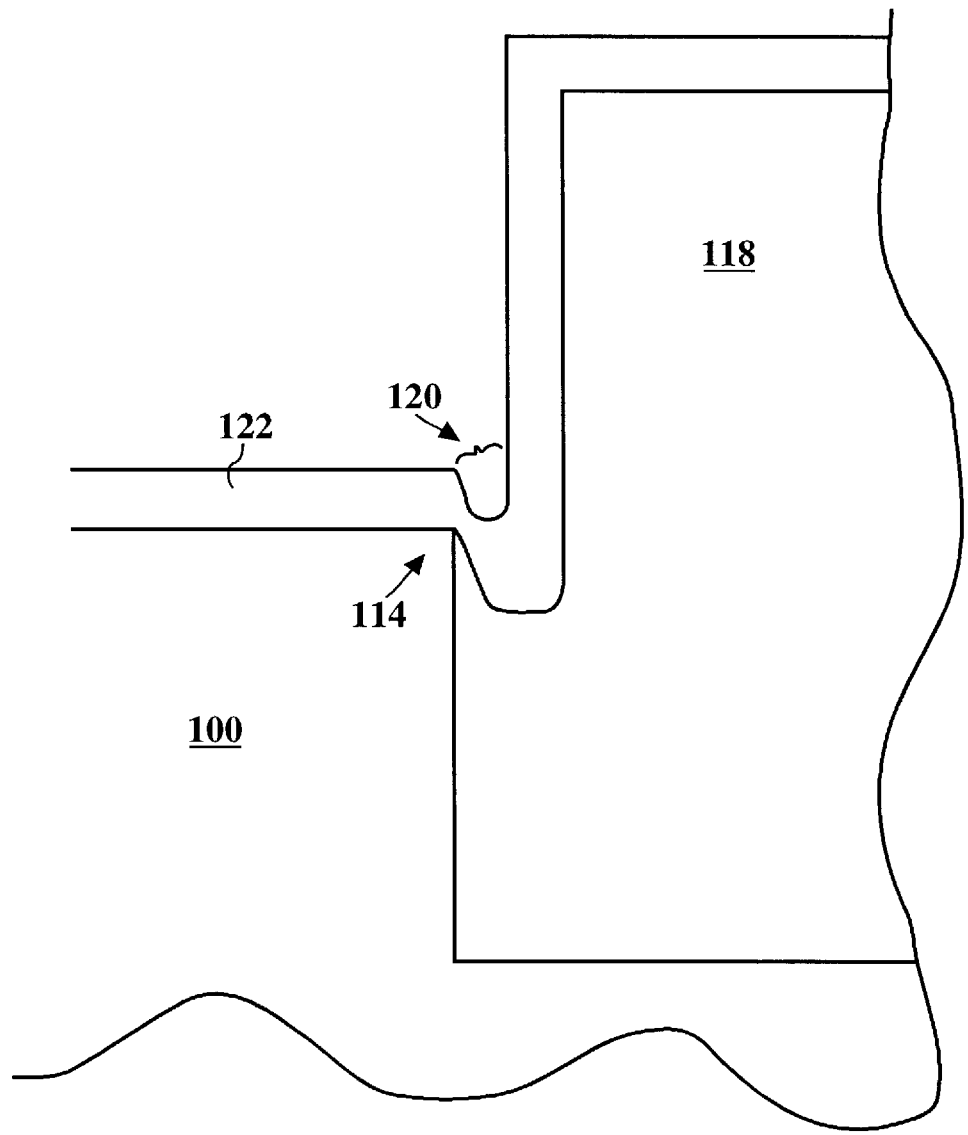
FIG. 1D is a cross-sectional view illustrating a trenching wrap-around condition associated with a prior art STI process.
Figure 2A:
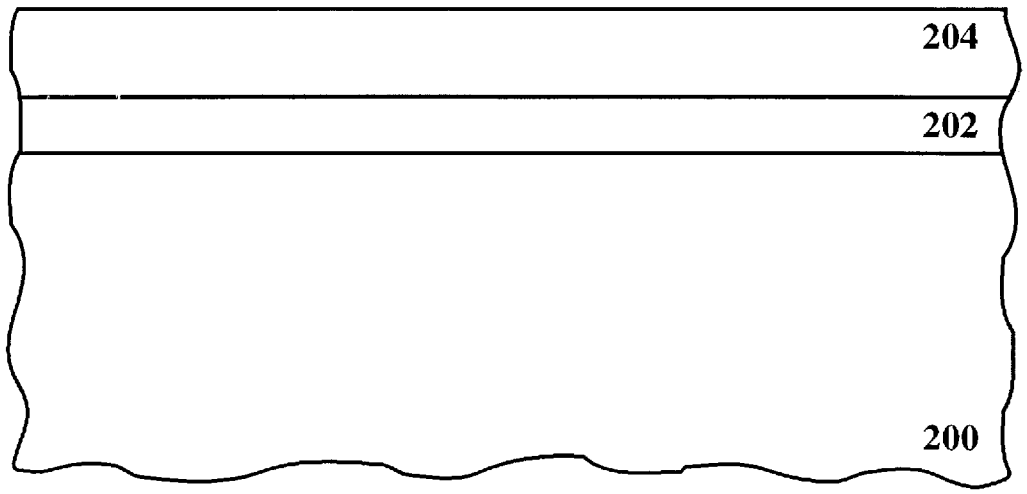
FIG. 2A is a cross-sectional view illustrating steps associated with the formation of a semiconductor device isolating structure in accordance with the present claimed invention.

The following discussion will pertain to cross-sectional views of a semiconductor device isolating structure in various states of fabrication. With reference now to FIG. 2A, a semiconductor substrate 200 such as, for example, silicon, is covered by stack comprised of a buffer oxide layer 202 and a nitride layer 204. For purposes of the present application, the stack overlying semiconductor substrate 200 is referred to as a "mask layer." Although such a semiconductor substrate and stack is specified in the present embodiment, the present invention is also well suited to various other semiconductor materials, and various other stack layers.

Figure 2B:
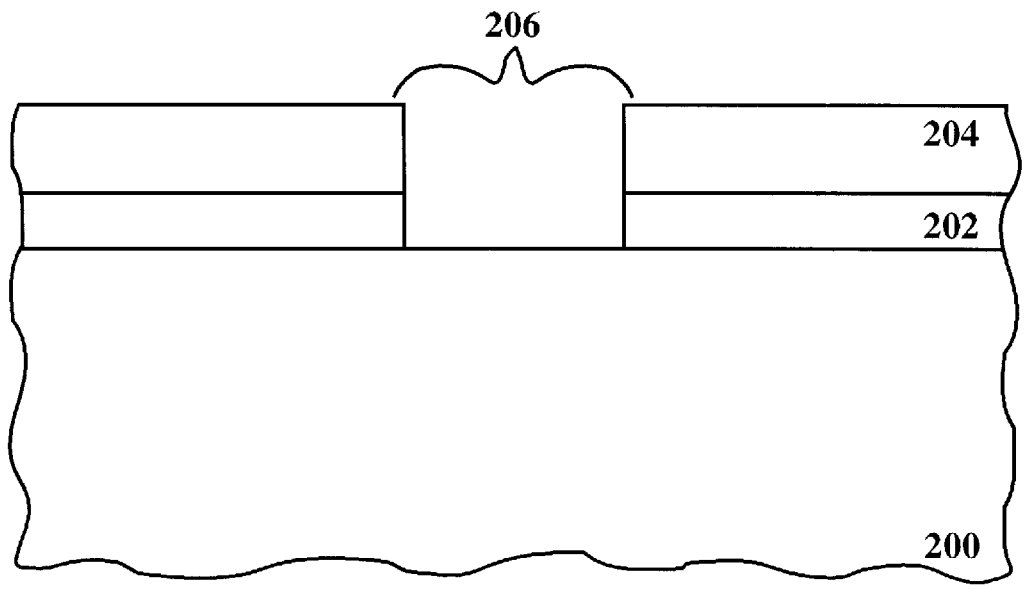
FIG. 2B is a cross-sectional view illustrating a step associated with the formation of a semiconductor device isolating structure in accordance with the present claimed invention.

Referring now to FIG. 2B, the present invention removes a portion of the mask layer. In so doing, a first region 206 of semiconductor substrate 200 is exposed. The present invention removes a portion of the mask layer using a plasma etch. Although such an etching method is used in the present embodiment, the present invention is also well suited to using various other methods to form the opening in the mask layer.

Figure 2C:
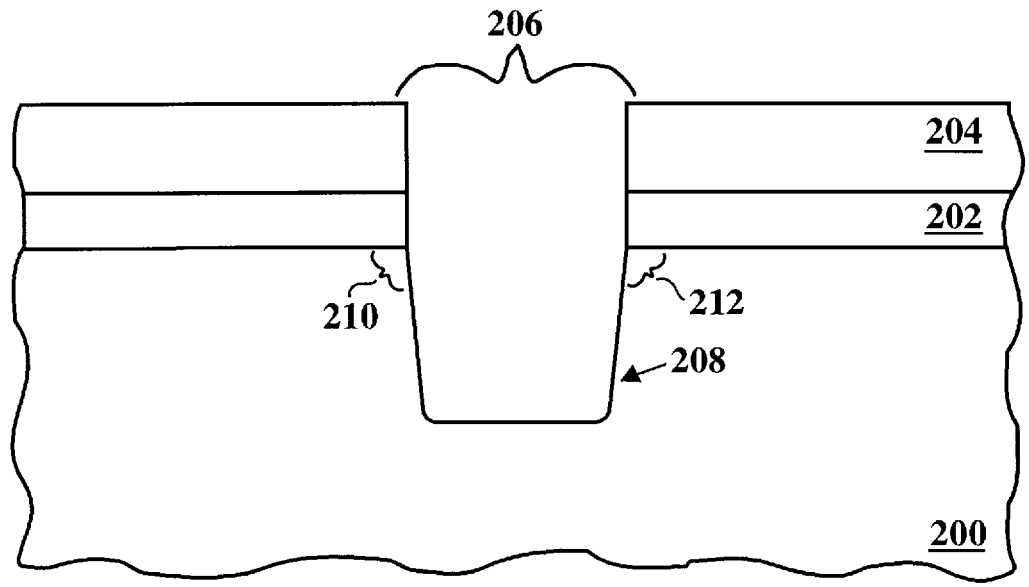
FIG. 2C is a cross-sectional view illustrating a step associated with the formation of a semiconductor device isolating structure in accordance with the present claimed invention.

With reference next to FIG. 2C, the present invention then forms a trench 208 into semiconductor substrate 200. As shown in FIG. 2C, sharp corners 210 and 212 are created in semiconductor substrate 200 at the intersection of the trench sidewalls and the top surface of semiconductor substrate 200. In the present embodiment, an etch chemistry of, for example, chlorine and hydrogen bromide ($Cl_2HBr$) is used to etch trench 208 into semiconductor substrate 100. Again, although such an etching method is used in the present embodiment, the present invention is also well suited to using various other methods to form trench 208 into semiconductor substrate 200.

Figure 2D:
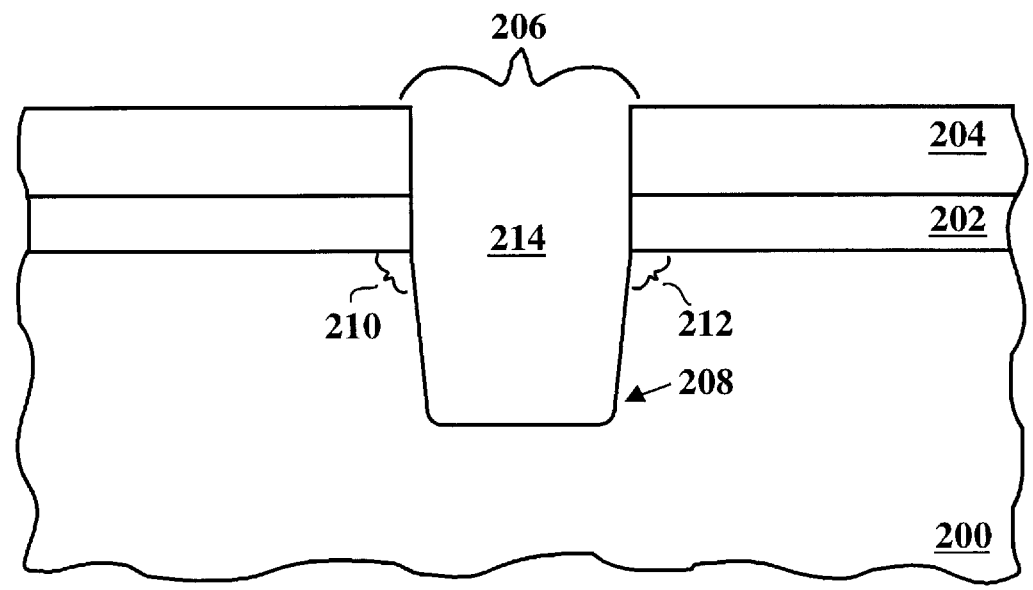
FIG. 2D is a cross-sectional view illustrating a step associated with the formation of a semiconductor device isolating structure in accordance with the present claimed invention.

Referring now to FIG. 2D, the present invention then deposits a dielectric material 214 into trench 208 such that a dielectric-filled trench is formed. Dielectric material 214 in trench 208 will comprise the semiconductor device isolating structure of the present invention. In the present embodiment, after the deposition step, dielectric material 214 extends out of trench 208 and above the top surface of nitride layer 204 of the present mask layer. In the present embodiment, dielectric material 214 is deposited into trench 208 via a low pressure chemical vapor deposition (LPCVD). As a result, dielectric material 214 is deposited into trench 208 and over the top surface of nitride layer 204. In the present embodiment, dielectric material 214 is comprised of silicon dioxide. Although such a dielectric material is used in the present embodiment, the present invention is also well suited to having various other dielectric materials deposited into trench 208 using various other deposition methods.

With reference still to FIG. 2D, after the deposition of dielectric material 214, excess dielectric material is removed. In the present embodiment, the excess dielectric material is removed using a chemical mechanical polishing (CMP) process. The top surface of nitride layer 204 acts as a stop for the CMP process in the present embodiment. Thus, the top surface of dielectric material 214 deposited into trench 208 is coplanar with the top surface of nitride layer 204 as shown in FIG. 2D. Therefore, the present invention maintains a planar topography even after the formation of the semiconductor isolating device. Although a CMP process is used to remove the excess dielectric material in the present embodiment, the present invention is also well suited to using various other oxide planarizing processes to remove the excess dielectric material. Other planarizing processes include, for example, a resist etchback. As shown in FIG. 2D, sharp corners 210 and 212 still remain in semiconductor substrate 200 even after the deposition of dielectric material 214.

Figure 2E:
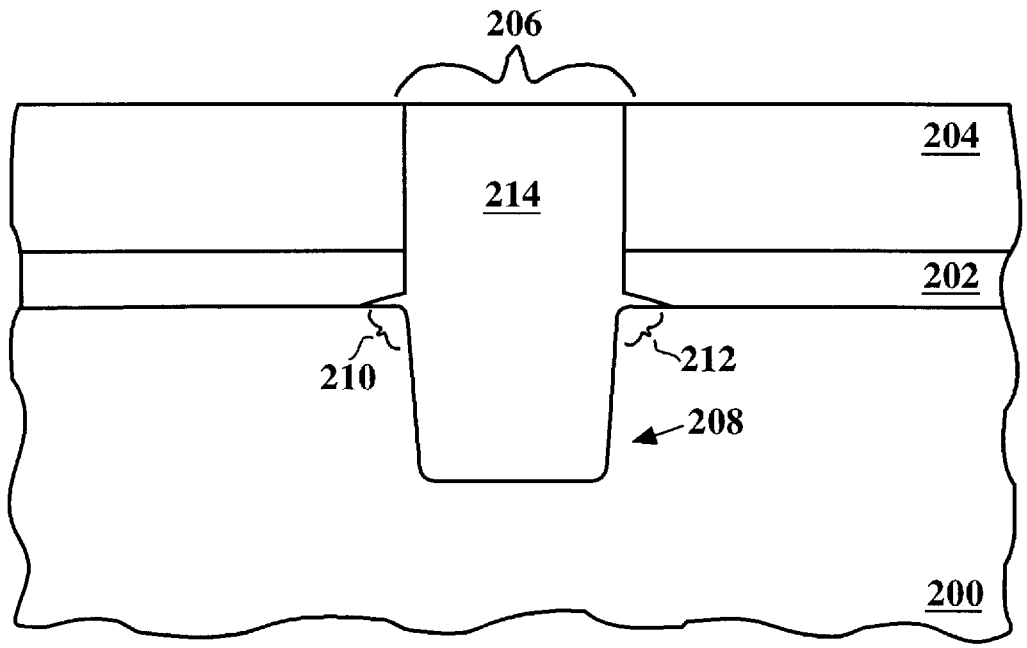
FIG. 2E is a cross-sectional view illustrating a step associated with the formation of a semiconductor device isolating structure in accordance with the present claimed invention.

With reference now to FIG. 2E, the present invention then exposes the dielectric-filled trench to an oxidizing environment. By filling trench 208 with dielectric material 214 before exposing the dielectric-filled trench to the oxidizing environment, the present invention provides for selective oxidation of semiconductor substrate 200. More specifically, the mask layer (i.e. buffer oxide layer 202 and nitride layer 204) shields the majority of semiconductor substrate 200 from the oxidizing environment. However, in region 206, no mask layer is present. Thus, the portions of semiconductor substrate 200 nearest region 206 (i.e. semiconductor sidewalls of trench 208) are less shielded from the oxidizing environment. By previously depositing dielectric material 214 into trench 208, the effect of the oxidizing environment varies with depth. That is, the oxidizing effect on semiconductor sidewalls of trench 208 is greater nearer the top of semiconductor substrate 200 and substantially weaker near the bottom of trench 208. Thus, the oxidizing environment has the greatest affect at the top surface of semiconductor substrate 200 nearest to region 206. Hence, the present invention selectively oxidizes semiconductor substrate 200 at and near corners 210 and 212. In the present embodiment, the dielectric-filled trench is exposed to an oxidizing environment comprised of oxygen-containing ambient at a temperature of approximately 800°–1075° degrees Celsius for a time period in the range of 5–40 minutes. Although such oxidizing parameters are recited in the present embodiment, the present invention is also well suited to varying the ambient, the temperature, or the exposure time of the oxidizing environment.

Referring still to FIG. 2E, in the present invention, oxidation of substrate 200 occurs most significantly under the mask layer at the intersection of the semiconductor substrate trench sidewalls and the top surface of semiconductor substrate 200. As a result, previously sharp corners 210 and 212 become smoothly rounded. FIG. 2E illustrates the initial rounding of previously sharp corners 210 and 212 after approximately 10 minutes of exposure to the oxidizing environment. As shown in FIG. 2E, the oxidation of semiconductor substrate 200 extends under the mask layer overlying semiconductor substrate 200.

Figure 2F:
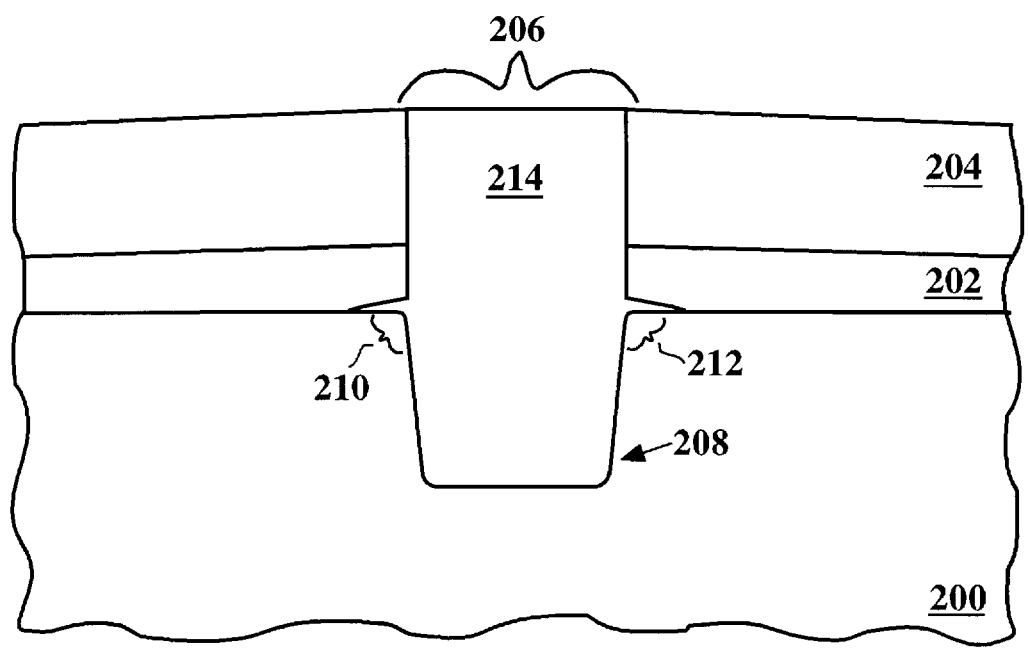
FIG. 2F is a cross-sectional view illustrating a step associated with the formation of a semiconductor device isolating structure in accordance with the present claimed invention.

Referring next to FIG. 2F, a side sectional view illustrates the additional oxidation and further rounding of previously sharp corners 210 and 212 after approximately 20 minutes of exposure to the oxidizing environment. As shown in FIG. 2F, previously sharp corners 210 and 214 now have a smooth rounded contour. Additionally, the oxidation of the present invention also causes a lifting of the overlying buffer oxide layer 202 and nitride layer 204 near previously sharp corners 210 and 212. That is, the present invention generates a soft edge or "bird's beak" type structure under the mask layer at previously sharp corners 210 and 212. Furthermore, the present invention achieves the smooth rounded corners and bird's beak structure without altering etch chemistries or significantly complicating the standard STI process.

Figure 2G:
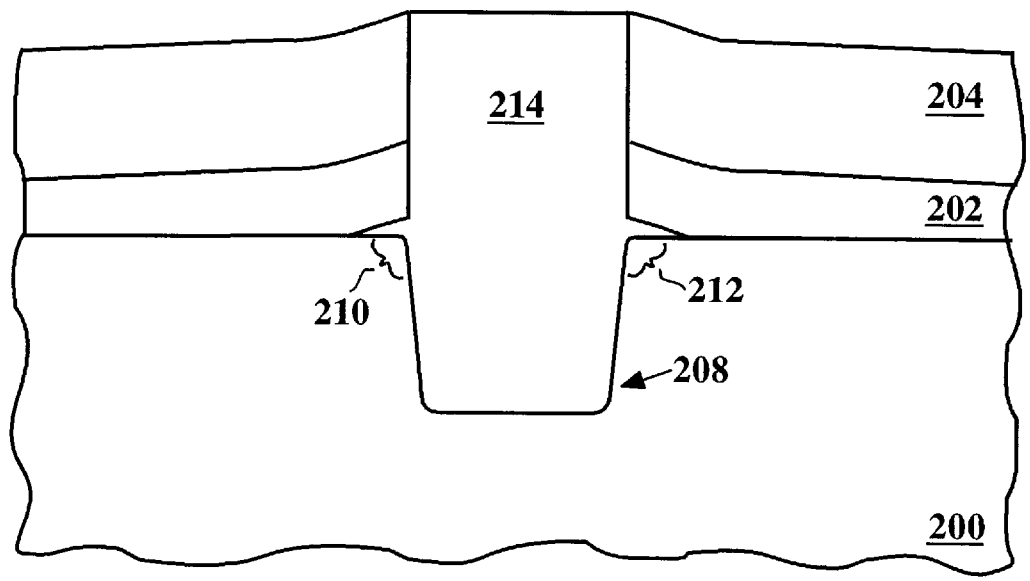
FIG. 2G is a cross-sectional view illustrating a step associated with the formation of a semiconductor device isolating structure in accordance with the present claimed invention.

Referring next to FIG. 2G, a side sectional view illustrates the additional oxidation and further rounding of previously sharp corners 210 and 212 after the completion of the oxidation step (e.g. approximately 40 minutes of exposure to the oxidizing environment). Semiconductor substrate 200 now has smooth rounded corners at the intersection of the semiconductor sidewalls of trench 208 and the top surface of semiconductor substrate 200. The present invention is well suited to varying the shape of the bird's beak structure by, for example, altering the parameters of the oxidizing environment. That is, by altering the parameters of the oxidizing environment, the present invention can, for example, extend or reduce the distance the bird's beak extends under the mask layer. Furthermore, by causing the formation of oxide which lifts the overlying buffer oxide layer 202 and nitride layer 204, the present invention increases the amount of oxide near previously sharp corners 210 and 212. This increased amount of oxide prevents trenching wrap-around from occurring during subsequent processing steps.

Figure 2H:
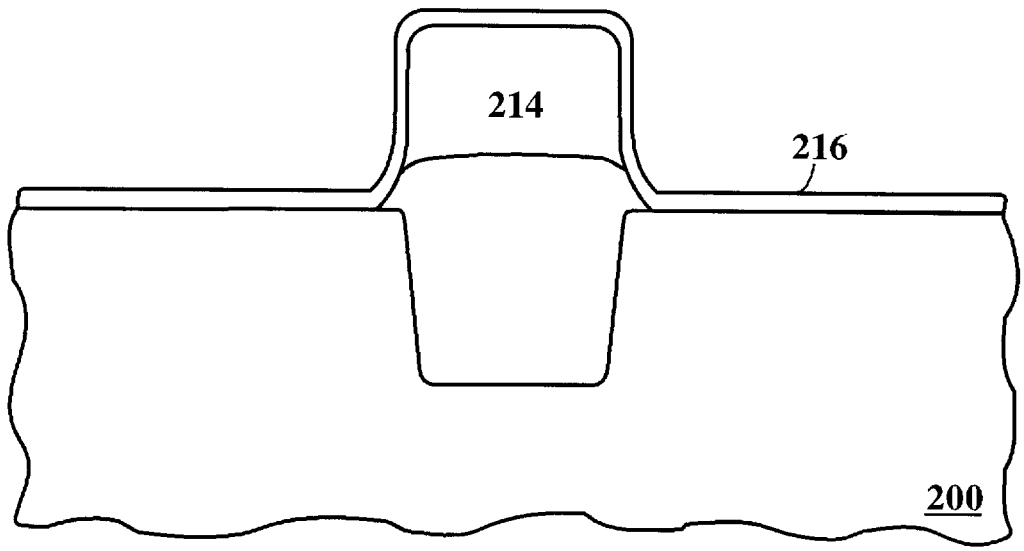
FIG. 2H is a cross-sectional view illustrating a step associated with the formation of a semiconductor device isolating structure in accordance with the present claimed invention.

With reference now to FIG. 2H, the present invention is shown after the removal of the mask layer, and after process step associated with the formation of a gate oxide layer 216. The present invention has eliminated sharp corners, and, as a result, has also eliminated the stresses induced by such sharp corners. Thus, the present invention prevents the deleterious creation of depressions in dielectric material 214. As a result, gate oxide layer 216 has a uniform thickness. Such uniform gate oxide thickness, achieved with the present invention, dramatically improves gate oxide integrity and eliminates subthreshold transistor leakage.

Thus, the present invention provides a semiconductor device isolating structure which does not have sharp stress-generating corners or sharp corners where a high E-field concentration will occur during device operation. The present invention also provides a method to form a semiconductor device isolating structure wherein the method does not require altering of conventional STI etching chemistries. The present invention further provides a method to form a semiconductor device isolating structure wherein the method does not significantly complicate the STI process.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

We claim:

1. A shallow trench isolation method for forming a semiconductor device isolating structure comprising the steps of:

a) forming an opening in a mask layer disposed over the top surface of a semiconductor substrate such that a first region of said semiconductor substrate is exposed;

b) forming a trench of a desired depth into said semiconductor substrate at said first region;

c) filling said trench with a dielectric material such that a dielectric-filled trench is formed; and d) exposing said dielectric-filled trench to an oxidizing environment to oxidize said semiconductor substrate under said mask layer proximate to the intersection of semiconductor substrate sidewalls of said trench and said top surface of said semiconductor substrate such that smoothly rounded semiconductor substrate corners are formed under said mask layer at said intersection of said semiconductor substrate sidewalls and said top surface of said semiconductor substrate.

2. The shallow trench isolation method of claim 1 wherein step a) comprises the step of:

forming an opening in a nitride layer and a buffer oxide layer overlying said top surface of said semiconductor substrate.

3. The shallow trench isolation method of claim 1 wherein step c) comprises the step of:

depositing said dielectric material into said trench such that said dielectric-filled trench is formed.

4. The shallow trench isolation method of claim 1 wherein step c) comprises the step of:

filling said trench with silicon dioxide such that a silicon dioxide-filled trench is formed.

5. The shallow trench isolation method of claim 1 wherein step c) comprises the step of:

filling said trench with said dielectric material until said dielectric material extends out of said trench and above the top surface of said mask layer.

6. The shallow trench isolation method of claim 5 wherein step c) further comprises the step of:

c1) performing an oxide planarization process to make the top surface of said dielectric material coplanar with said top surface of said mask layer.

7. The shallow trench isolation method of claim 6 wherein step c1) comprises the step of:

chemical mechanical polishing of said top surface of said dielectric material to make said top surface of said dielectric material coplanar with said top surface of said mask layer.

8. The shallow trench isolation method of claim 1 wherein step d) comprises the step of:

exposing said dielectric-filled trench to an oxidizing environment comprised of oxygen-containing ambient at a temperature of approximately 800°–1075° degrees Celsius for a time period in the range of 5–40 minutes.

9. A method for forming a semiconductor device isolating structure, said method comprising the steps of:

a) forming an opening in a mask layer disposed over the top surface of a semiconductor substrate such that a first region of said semiconductor substrate is exposed;

b) etching a trench of a desired depth into said semiconductor substrate at said first region;

c) depositing a dielectric material into said trench such that a dielectric-filled trench is formed, said dielectric material extending out of said trench and above the top surface of said mask layer; and d) selectively oxidizing said semiconductor substrate at corners disposed under said mask layer such that smoothly rounded semiconductor substrate corners are formed under said mask layer, said corners formed by the intersection of semiconductor substrate sidewalls of said trench and said top surface of said semiconductor substrate, said oxidation of said semiconductor substrate achieved by exposing said dielectric-filled trench to an oxidizing environment.

10. The semiconductor device isolating structure forming method as recited in claim 9 wherein step a) comprises the step of:

forming an opening in a nitride layer and a buffer oxide layer overlying said top surface of said semiconductor substrate.

11. The semiconductor device isolating structure forming method as recited in claim 9 wherein step c) comprises the step of:

filling said trench with silicon dioxide such that a silicon dioxide-filled trench is formed.

12. The semiconductor device isolating structure forming method as recited in claim 9 wherein step c) further comprises the step of:

c1) performing an oxide planarization process to make the top surface of said dielectric material coplanar with said top surface of said mask layer.

13. The semiconductor device isolating structure forming method as recited in claim 12 wherein step c1) comprises the step of:

chemical mechanical polishing of said top surface of said dielectric material to make said top surface of said dielectric material coplanar with said top surface of said mask layer.

14. The semiconductor device isolating structure forming method as recited in claim 9 wherein step d) comprises the step of:

exposing said dielectric-filled trench to an oxidizing environment comprised of oxygen-containing ambient at a temperature of approximately 800°–1075° degrees Celsius for a time period in the range of 5–40 minutes.

15. A method for forming a semiconductor device isolating structure having an ideal profile comprising the steps of:

a) forming an opening through both a nitride layer and a buffer oxide layer stacked on the top surface of a semiconductor substrate such that a first region of said semiconductor substrate is exposed;

b) etching a trench of a desired depth into said semiconductor substrate at said first region;

c) depositing silicon dioxide into said trench such that a silicon dioxide-filled trench is formed, said silicon dioxide extending out of said trench and above the top surface of said stacked nitride layer and said buffer oxide layer; and d) selectively oxidizing said semiconductor substrate at corners disposed under said stacked nitride layer and said buffer oxide layer such that smoothly rounded semiconductor substrate corners are formed under said stacked nitride layer and said buffer oxide layer, said corners formed by the intersection of semiconductor substrate sidewalls of said trench and said top surface of said semiconductor substrate, said oxidation of said semiconductor substrate achieved by exposing said silicon dioxide-filled trench to an oxidizing environment.

16. The semiconductor device isolating structure forming method as recited in claim 15 wherein step c) further comprises the step of:

c1) performing an oxide planarization process to make the top surface of said silicon dioxide coplanar with said top surface of said stacked nitride layer and said buffer oxide layer.

17. The semiconductor device isolating structure forming method as recited in claim 16 wherein step c1) comprises the step of:

chemical mechanical polishing of said top surface of said silicon dioxide to make said top surface of said silicon dioxide coplanar with said top surface of said stacked nitride layer and said buffer oxide layer.

18. The semiconductor device isolating structure forming method as recited in claim 15 wherein step d) comprises the step of:

exposing said silicon dioxide-filled trench to an oxidizing environment comprised of oxygen-containing ambient at a temperature of approximately 800°–1075° degrees Celsius for a time period in the range of 5–40 minutes.

* * * * *